(12) United States Patent
    Hou

(10) Patent No.: US 11,404,671 B2
(45) Date of Patent: Aug. 2, 2022

(54) ORGANIC ELECTROLUMINESCENCE DEVICE

(71) Applicant: Wuhan China Star Optoelectronics Semiconductor Display Technology Co., Ltd., Wuhan (CN)

(72) Inventor: Xiaomeng Hou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 139 days.

(21) Appl. No.: 16/769,686

(22) PCT Filed: Mar. 16, 2020

(86) PCT No.: PCT/CN2020/079494
    § 371 (c)(1),
    (2) Date: Jun. 4, 2020

(87) PCT Pub. No.: WO2021/098093
    PCT Pub. Date: May 27, 2021

(65) Prior Publication Data
    US 2021/0408481 A1    Dec. 30, 2021

(30) Foreign Application Priority Data
    Nov. 22, 2019 (CN) .......................... 201911157478.4

(51) Int. Cl.
    *H01L 29/08*     (2006.01)
    *H01L 51/52*     (2006.01)
    *H01L 51/56*     (2006.01)

(52) U.S. Cl.
    CPC .......... *H01L 51/5256* (2013.01); *H01L 51/56* (2013.01)

(58) Field of Classification Search
    CPC ............................ H01L 51/5256; H01L 51/56
    See application file for complete search history.

(56) References Cited

U.S. PATENT DOCUMENTS 10,205,123 B2 * 2/2019 Jin ...................... H01L 51/0018
2017/0155081 A1   6/2017 Zeng et al.
2019/0157607 A1 * 5/2019 Kim .................... H01L 51/5237
(Continued)

FOREIGN PATENT DOCUMENTS

CN   102593371    7/2012
CN   104103660   10/2014
CN   105118933   12/2015
(Continued)

*Primary Examiner* — Caleb E Henry

(57) ABSTRACT

An organic electroluminescence device is disclosed. The organic electroluminescence device includes a light emitting layer disposed on a substrate and an encapsulation layer covering the light emitting layer. The encapsulation layer includes at least one inorganic layer and at least one organic layer, wherein the inorganic layer and the organic layer of the encapsulation layer are disposed alternately, and the at least one inorganic layer is disposed on the light emitting layer and covers the light emitting layer; and two buffer layers, wherein each of the buffer layers is disposed between the inorganic layer and the organic layer which are adjacent, and a material of the buffer layer is at least one of a tetramethylsilane monomer, an ethoxysilane monomer, or a silicon oxycarbide monomer.

11 Claims, 1 Drawing Sheet

(56) References Cited

U.S. PATENT DOCUMENTS

2020/0216955 A1* 7/2020 Benz .................. H01L 21/6776
2020/0321554 A1   10/2020 Qian et al.

FOREIGN PATENT DOCUMENTS

| CN | 106876607   | 6/2017  |
|----|-------------|---------|
| CN | 107302014   | 10/2017 |
| CN | 108832023   | 11/2018 |
| CN | 109686760   | 4/2019  |
| JP | 2001-338754 | 12/2001 |
| JP | 2010-083024 | 4/2010  |

* cited by examiner

ORGANIC ELECTROLUMINESCENCE DEVICE

RELATED APPLICATIONS

This application is a National Phase of PCT Patent Application No. PCT/CN2020/079494 having International filing date of Mar. 16, 2020, which claims the benefit of priority of Chinese Patent Application No. 201911157478.4 filed on Nov. 22, 2019. The contents of the above applications are all incorporated by reference as if fully set forth herein in their entirety.

FIELD AND BACKGROUND OF THE INVENTION

The present disclosure relates to the field of organic electroluminescence devices, and particularly relates to an organic electroluminescence device.

Flexible organic electroluminescence devices with foldability have aroused widespread attention in industry and have become a research hot spot in field of display. Metal electrodes of organic electroluminescence devices are easily oxidized by effect of oxygen. Organic luminescent materials are oxidized or crystallized, thereby reducing light emitting domains of organic electroluminescence devices and even generating dark spots. Therefore, encapsulation layers are usually used on the organic electroluminescence devices to protect the devices.

The encapsulation layers of common organic electroluminescence devices are formed into an interlayer structure of inorganic layer/organic layer/inorganic layer to protect the organic electroluminescence devices by techniques of plasma enhanced chemical vapor deposition and inkjet printing. Please refer to FIG. 1, FIG. 1 is a structural schematic diagram of an organic electroluminescence device of current technology. As shown in FIG. 1, the organic electroluminescence device includes a substrate 10, a light emitting layer 20 disposed on the substrate 10, and an encapsulation layer 30 disposed on the substrate 10 and covering the light emitting layer 20. The encapsulation layer 30 includes a first inorganic layer 301, an organic layer 302, and a second inorganic layer 303. The first inorganic layer 301 and the second inorganic layer 303 are film layers made of inorganic materials such as SiONx, SiOx, SiNx, etc. The organic layer 302 is a film layer made of an acrylic organic material.

Concerning flexible organic electroluminescence devices with foldability, stress generated from bending poses challenge to bonding strength between the encapsulation layer and top and bottom film layers. Meanwhile, impact of uncontrollable external force also requires the encapsulation layer to have higher mechanical strength and buffer performance to better protect the organic electroluminescence device.

In view of lift off and fracture of the encapsulation layer that may occur on the flexible organic electroluminescence device and problems such as external impact destroying the organic electroluminescence device, there is an urgent need of a new organic electroluminescence device.

SUMMARY OF THE INVENTION

The present disclosure provides an organic electroluminescence device to enhance bonding strength between the inorganic layer and the organic layer to improve anti-bending performance of the organic electroluminescence device by disposing the buffer layer between the inorganic layer and the organic layer which are adjacent in the encapsulation layer, and a material of the buffer layer is at least one of a tetramethylsilane monomer, an ethoxysilane monomer, or a silicon oxycarbide monomer. Moreover, anti-impact performance of the organic electroluminescence device is improved by the organic layer made of a transparent polyamide resin material.

An embodiment of the present disclosure provides an organic electroluminescence device, which includes a light emitting layer disposed on a substrate and an encapsulation layer covering the light emitting layer, wherein the encapsulation layer includes at least one inorganic layer and at least one organic layer, wherein the at least one inorganic layer and the at least one organic layer of the encapsulation layer are disposed alternately, and the at least one inorganic layer is disposed on the light emitting layer and covers the light emitting layer; and two buffer layers, wherein each of the buffer layers is disposed between the inorganic layer and the organic layer which are adjacent, and a material of the buffer layer is at least one of a tetramethylsilane monomer, an ethoxysilane monomer, or a silicon oxycarbide monomer.

Furthermore, the encapsulation layer includes a first inorganic layer, one of the organic layer, and a second inorganic layer disposed on the light emitting layer and covering the light emitting layer, wherein a first buffer layer is disposed between the first inorganic layer and the organic layer, and a second buffer layer is disposed between the organic layer and the second inorganic layer.

Furthermore, a material of the organic layer is a transparent organic material.

Furthermore, a material of the organic layer is a polyamide resin.

Furthermore, materials of the first inorganic layer and the second inorganic layer are respectively at least one of silica, silicon oxynitride, aluminum oxide, or aluminum nitride.

An embodiment of the present disclosure further provides an organic electroluminescence device, which includes a light emitting layer disposed on a substrate and an encapsulation layer covering the light emitting layer. The encapsulation layer includes at least one inorganic layer and at least one organic layer, wherein a buffer layer is disposed between the inorganic layer and the organic which are adjacent, and a material of the buffer layer is at least one of a tetramethylsilane monomer, an ethoxysilane monomer, or a silicon oxycarbide monomer.

Furthermore, the at least one inorganic layer and the at least one organic layer of the encapsulation layer are disposed alternately, and the at least one inorganic layer is disposed on the light emitting layer and covers the light emitting layer.

Furthermore, the encapsulation layer includes a first inorganic layer, one of the organic layer, and a second inorganic layer disposed on the light emitting layer and covering the light emitting layer, wherein a first buffer layer is disposed between the first inorganic layer and the organic layer, and a second buffer layer is disposed between the organic layer and the second inorganic layer.

Furthermore, a material of the organic layer is a transparent organic material.

Furthermore, a material of the organic layer is a polyamide resin.

Furthermore, materials of the first inorganic layer and the second inorganic layer are respectively at least one of silica, silicon oxynitride, aluminum oxide, or aluminum nitride.

An embodiment of the present disclosure further provides an encapsulation method of an organic electroluminescence device, and the encapsulation layer includes: a step of providing a substrate; a step of forming a light emitting layer on the substrate; a step of forming an encapsulation layer on the light emitting layer; wherein the encapsulation layer includes at least one inorganic layer and at least one organic layer, a buffer layer is disposed between the inorganic layer and the organic which are adjacent, and a material of the buffer layer is at least one of a tetramethylsilane monomer, an ethoxysilane monomer, or a silicon oxycarbide monomer.

Furthermore, in the step of forming the encapsulation layer on the light emitting layer, the buffer layer is formed from an evaporation chemical vapor deposition method, a sputtering chemical vapor deposition method, a low temperature chemical vapor deposition method, or a plasma enhanced chemical vapor deposition method.

Furthermore, in the step of forming the encapsulation layer on the light emitting layer, the organic layer is formed from an inkjet printing method, a chemical vapor deposition method, and a printing method.

The beneficial effect is to enhance bonding strength between the inorganic layer and the organic layer to improve anti-bending performance of the organic electroluminescence device, thereby balancing residual stress generated during a bending process of the inorganic layer, and furtherly lowering possibility of lift off failure in the bending process so as to improve bending performance of the organic electroluminescence device by disposing the buffer layer between the inorganic layer and the organic layer of the encapsulation layer, and wherein the material of the buffer layer is at least one of a tetramethylsilane monomer, an ethoxysilane monomer, or a silicon oxycarbide monomer. Moreover, on the basis of not affecting optical performance, transparent polyamide resin is selected as the material of the organic layer. The material has good tensile strength and impact resistance, which can improve anti-impact performance of the organic electroluminescence device.

BRIEF DESCRIPTION OF THE SEVERAL VIEWS OF THE DRAWINGS

The technical solutions and other advantageous effects of the present invention will be apparent with reference to the following accompanying drawings and detailed description of embodiments of the present disclosure.

DESCRIPTION OF SPECIFIC EMBODIMENTS OF THE INVENTION

Figure 1:
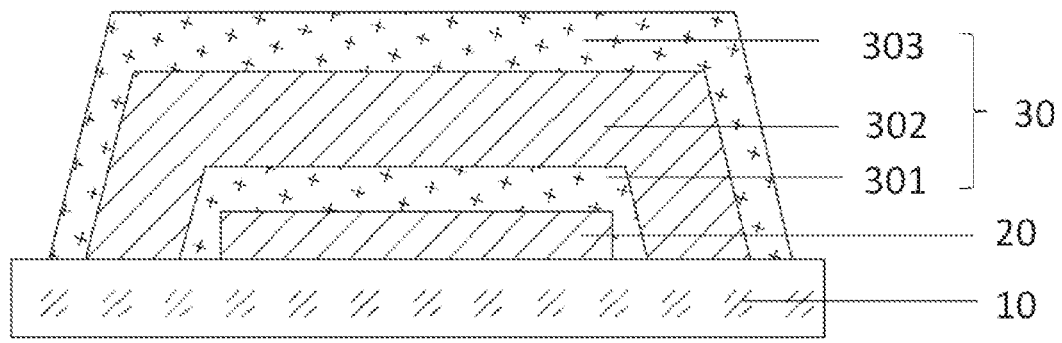
FIG. 1 is a structural schematic diagram of an organic electroluminescence device in the prior art.

The specific structural and functional details disclosed are merely representative and are for the purpose of describing exemplary embodiments of the present disclosure. However, the present disclosure may be specifically implemented in many alternative forms and should not be construed as being limited only to the embodiments set forth herein.

In the description of the present disclosure, it is to be understood that the orientation or positional relationship indicated by the terms "center", "transverse", "upper", "lower", "left", "right", "vertical", "horizontal", "top", "bottom", "inside", "outside", etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, unless it has another explanation, the meaning of "a plurality" is two or more. Moreover, the terms "comprising" any deformation of them are intended to cover non-exclusive inclusions.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections; may also be direct connections or indirect connections via intervening structures; may also be inner communications of two elements. For persons skilled in the art in this field, the specific meanings of the above terms in the present disclosure can be understood with specific cases.

The terms used herein is for the purpose of describing specific embodiments only and is not intended to limit exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The present disclosure will be further described in detail below in combination with the drawings and embodiments.

Figure 2:
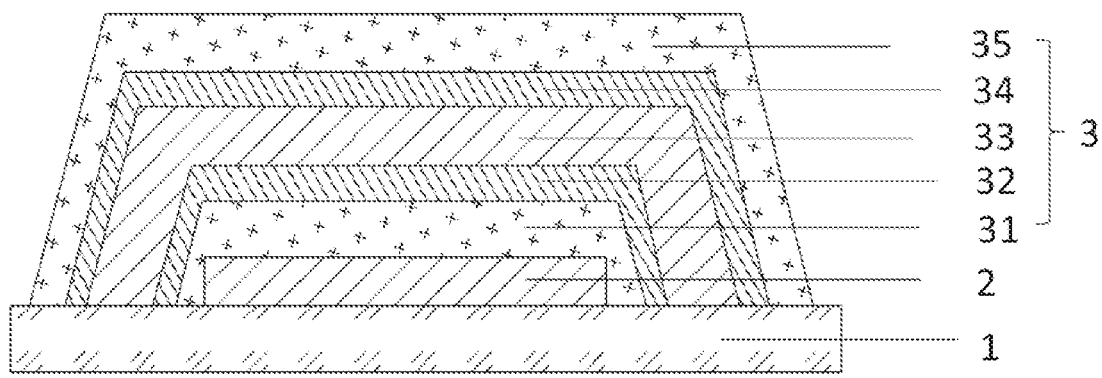
FIG. 2 is a structural schematic diagram of an organic electroluminescence device of the present disclosure.

Please refer to FIG. 2, FIG. 2 is a structural schematic diagram of an organic electroluminescence device of the present disclosure. As illustrated in FIG. 2, in an embodiment of the present disclosure, an organic electroluminescence device is provided. The organic electroluminescence device includes a light emitting layer 2 disposed on a substrate 1 and an encapsulation layer 3 covering the light emitting layer 2. The encapsulation layer 3 is used to prevent the light emitting layer 2 from exposure to an external water/oxygen environment.

In this embodiment, the encapsulation layer 3 includes at least one inorganic layer and at least one organic layer. A buffer layer is disposed between the inorganic layer and the organic which are adjacent. The at least one inorganic layer and the at least one organic layer of the encapsulation layer 3 are disposed alternately, and the at least one inorganic layer is disposed on the light emitting layer 2 and covers the light emitting layer 2. Moreover, the outermost layer of the encapsulation layer 3 is an inorganic layer to block the external water/oxygen environment from entering interior of the encapsulation layer 3.

As illustrated in FIG. 2, specifically, the encapsulation layer 3 includes a first inorganic layer 31, one of the organic layer 33, and a second inorganic layer 35 disposed on the light emitting layer 2 and covering the light emitting layer 2. Furthermore, a first buffer layer 32 is disposed between the first inorganic layer 31 and the organic layer 33, and a second buffer layer 34 is disposed between the organic layer 33 and the second inorganic layer 35.

In this embodiment, a material of the buffer layer is selected from at least one of a tetramethylsilane (TMS, Si(CH$_3$)4) monomer, an ethoxysilane (TEOS) monomer, or silicon oxycarbide (SiOxCy) monomer.

As a preferred embodiment, the materials of the first buffer layer 32 and the second buffer layer 34 are the tetramethylsilane monomer. Because C—H bonds of the tetramethylsilane (Si(CH3)4) are able to lower surface energy of a base layer and improve flatness of deposition of the inorganic layer, an opportunity for water vapor to enter the organic electroluminescence device is reduced, and a crosslinking C—Si bond can balance residual stress generated from the bending process of the first inorganic layer 31 and the second inorganic layer 35. Therefore, in this embodiment, the first buffer layer 32 and the second buffer layer 34 are able to lower possibility of lift off failure in the bending process, and have effect of eliminating the residual stress of the first inorganic layer 31 and the second inorganic layer 35, thereby enhancing bonding forces between the first inorganic layer 31 and the organic layer 33 and between the organic layer 33 and the second inorganic layer 35.

Continue referring FIG. 2, the organic layer 33 is disposed between the first buffer layer 32 and the second buffer layer 34. A material of the organic layer 33 is preferably a transparent organic material. Furthermore, a nylon material (polyamide, PA) is selected as a preferred solution for the material of the organic layer 33. In other embodiment, the material of the organic layer 33 can further be selected from polyester, polyacrylate, polyimide, and polycarbonate, and it is not limited herein.

In this embodiment, the material of the organic layer 33 is a polyamide resin. Because the polyamide resin has good characteristics such as toughness, softness, strong bonding ability, wear-resistance, oil-resistance, water-resistance, anti-mold, water absorption, etc., and a light transmittance rate of the polyamide resin is high and is close to optical glass, therefore, on the basis of not affecting optical performance, the organic layer 33 made of the polyamide resin has good tensile strength and impact resistance, which is conducive to improving anti-impact performance on the organic electroluminescence device.

The following is combined with FIG. 2 to describe an encapsulation method of the organic electroluminescence device of the present disclosure in detail. The encapsulation method includes:

S01: a step of providing a substrate 1. In this embodiment, a material of the substrate 1 is polyimide (PI). The polyimide has good thermal performance, good mechanical performance, good electric performance, good stability, good film formation, high optical transparency, low moisture absorption rate, flatness performance, and bonding performance, which are conducive to improving bending performance of the substrate 1.

S02: a step of forming a light emitting layer 2 on the substrate 1. In this embodiment, a vacuum thermal evaporation method is used to form the light emitting layer 2.

S03: a step of forming an encapsulation layer 3 on the light emitting layer 2.

Furthermore, the encapsulation layer 3 includes at least one inorganic layer and at least one organic layer, and a buffer layer is disposed between the inorganic layer and the organic which are adjacent. A material of the buffer layer is at least one of a tetramethylsilane monomer, an ethoxysilane monomer, or a silicon oxycarbide monomer.

Specifically, in the step of forming the encapsulation layer 3 on the light emitting layer 2, the buffer layer is formed from an evaporation chemical vapor deposition method, a sputtering chemical vapor deposition method, a low temperature chemical vapor deposition method, or a plasma enhanced chemical vapor deposition method. As a preferred embodiment, the plasma enhanced chemical vapor deposition method is selected to form the buffer layer, and a thickness of the buffer layer is regulated by regulating parameters of a temperature, atmosphere, pressure, and time.

Furthermore, in the step of forming the encapsulation layer 3 on the light emitting layer 2, the organic layer 33 is formed from an inkjet printing method, a sealing or dispensing method, a chemical vapor deposition method, and a printing method. Quality and the thickness of the organic layer 33 are regulated by regulating parameters of an ink concentration, viscosity, and a solvent.

In addition, in the step of forming the encapsulation layer 3 on the light emitting layer 2, the inorganic layer is formed on the substrate 1 from a plasma enhanced chemical vapor deposition method, an atomic layer deposition method, or a method of pulse laser deposition technology. A material of the inorganic layer is selected from a composition combined by at least one of silica, silicon oxynitride, aluminum oxide, or aluminum nitride. The inorganic layer is able to effectively suppress permeation of water vapor and oxygen.

It will be understood by those skilled in the art that the organic electroluminescence device of the embodiments mentioned above can be included in a display panel, which makes the display panel have flexibility, and foldability is realized.

For the specific implementation of each operation, the embodiments mentioned above can be referred to, and unnecessary details will not be given herein.

In summary, by disposing the first buffer layer 32 between the inorganic layer 31 and the organic layer 33, and by disposing the second buffer layer 34 between the organic layer 33 and the second inorganic layer 35, and wherein the materials of the first buffer layer 32 and the second buffer layer 34 are respectively at least one of a tetramethylsilane monomer, an ethoxysilane monomer, or a silicon oxycarbide monomer, the present disclosure enhances bonding strength between the first inorganic layer 31 and the organic layer 33 and between the organic layer 33 and the second inorganic layer 35, thereby balancing residual stress generated during the bending process of the inorganic layer, and furtherly lowering possibility of lift off failure in the bending process, so as to improve bending performance of the organic electroluminescence device. Moreover, on the basis of not affecting optical performance, the transparent polyamide resin is selected as the material of the organic layer 33. The material has good tensile strength and impact resistance, which can improve anti-impact performance on the organic electroluminescence device.

It can be understood, that for those of ordinary skill in the art, various other corresponding changes and modifications can be made according to the technical solutions and technical ideas of the present disclosure, and all such changes and modifications are intended to fall within the scope of protection of the claims of the present disclosure.

What is claimed is:

1. An organic electroluminescence device, comprising a light emitting layer disposed on a substrate and an encapsulation layer covering the light emitting layer, wherein the encapsulation layer comprises:

a first inorganic layer, an organic layer, and a second inorganic layer disposed on the light emitting layer and covering the light emitting layer;

a first buffer layer disposed between the first inorganic layer and the organic layer; and a second buffer layer is disposed between the organic layer and the second inorganic layer, and wherein a material of the first buffer layer and the second buffer layer is at least one of a tetramethylsilane monomer, an ethoxysilane monomer, or a silicon oxycarbide monomer.

2. The organic electroluminescence device as claimed in claim 1, wherein a material of the first inorganic layer and the second inorganic layer is a transparent organic material.

3. The organic electroluminescence device as claimed in claim 1, wherein a material of the first inorganic layer and the second inorganic layer is a polyamide resin.

4. The organic electroluminescence device as claimed in claim 1, wherein materials of the first inorganic layer and the second inorganic layer are respectively at least one of silica, silicon oxynitride, aluminum oxide, or aluminum nitride.

5. An organic electroluminescence device, comprising a light emitting layer disposed on a substrate and an encapsulation layer covering the light emitting layer, wherein the encapsulation layer comprises:

a first inorganic layer, an organic layer, and a second inorganic layer disposed on the light emitting layer and covering the light emitting layer;

a first buffer layer disposed between the first inorganic layer and the organic layer; and a second buffer layer disposed between the organic layer and the second inorganic layer, and wherein a material of the first buffer layer and the second buffer layer is a tetramethylsilane monomer.

6. The organic electroluminescence device as claimed in claim 5, wherein a material of the first inorganic layer and the second inorganic layer is a transparent organic material.

7. The organic electroluminescence device as claimed in claim 5, wherein a material of the first inorganic layer and the second inorganic layer is a polyamide resin.

8. The organic electroluminescence device as claimed in claim 5, wherein materials of the first inorganic layer and the second inorganic layer are respectively at least one of silica, silicon oxynitride, aluminum oxide, or aluminum nitride.

9. An encapsulation method of an organic electroluminescence device, wherein the encapsulation method comprises:

providing a substrate;

forming a light emitting layer on the substrate; and forming an encapsulation layer on the light emitting layer, wherein the encapsulation layer comprises: a first inorganic layer, an organic layer, and a second inorganic layer disposed on the light emitting layer and covering the light emitting layer;

a first buffer layer disposed between the first inorganic layer and the organic layer; and a second buffer layer disposed between the organic layer and the second inorganic layer, and wherein a material of the first buffer layer and the second buffer layer is at least one of a tetramethylsilane monomer, an ethoxysilane monomer, or a silicon oxycarbide monomer.

10. The encapsulation method of the organic electroluminescence device as claimed in claim 9, wherein in the step of forming the encapsulation layer on the light emitting layer, the first buffer layer and the second buffer layer are formed from an evaporation chemical vapor deposition method, a sputtering chemical vapor deposition method, a low temperature chemical vapor deposition method, or a plasma enhanced chemical vapor deposition method.

11. The encapsulation method of the organic electroluminescence device as claimed in claim 9, wherein in the step of forming the encapsulation layer on the light emitting layer, the organic layer is formed from an inkjet printing method, a chemical vapor deposition method, and a printing method.

* * * * *